United States Patent [19]
Barns

[11] 3,976,535
[45] Aug. 24, 1976

[54] SCREENING SEEDS FOR QUARTZ GROWTH

[75] Inventor: Robert Leroy Barns, Berkeley Heights, N.J.

[73] Assignee: Bell Telephone Laboratories, Incorporated, Murray Hill, N.J.

[22] Filed: May 27, 1975

[21] Appl. No.: 580,782

[52] U.S. Cl.............................. 156/601; 156/623 Q; 23/273 R; 23/301; 23/230 R; 156/DIG. 64; 156/DIG. 65
[51] Int. Cl.².................... B01J 17/04; C01B 33/12
[58] Field of Search............. 23/273 H, 295, 301 R, 23/230 R; 156/601, 623 Q

[56] References Cited
UNITED STATES PATENTS

| | | | |
|---|---|---|---|
| 1,918,976 | 7/1933 | Marrison........................ | 156/DIG. 4 |
| 2,423,357 | 7/1947 | Watrobski......................... | 156/601 |
| 2,558,745 | 7/1951 | Friedman........................ | 23/301 R |
| 2,871,192 | 1/1959 | Augustine........................ | 23/301 R |
| 2,907,808 | 10/1959 | Stanley........................... | 156/623 Q |
| 3,291,575 | 12/1966 | Sawyer........................... | 156/601 |
| 3,607,108 | 9/1971 | Gehres........................... | 23/301 R |
| 3,788,890 | 1/1974 | Mader.............................. | 156/601 |
| 3,853,596 | 12/1974 | Distler............................. | 156/602 |
| 3,917,506 | 11/1975 | Lind................................ | 23/301 R |

Primary Examiner—Stephen J. Emery
Attorney, Agent, or Firm—P. V. D. Wilde

[57] ABSTRACT z-face quartz of good quality suitable for piezoelectric applications can be grown at rates near 35 mil/da at p-T conditions easily accessible in commercial autoclaves. The growth conditions are predictable from previous systematic studies of growth rate. Cracking of grown crystals either during growth or in crystal processing can be severe and can account for as much as 15–50% yield loss. However, much of this loss can be reduced by carefully screening seeds for strain using the new polariscopic technique of the invention. Strain (and cracking) are severe with growth on highly strained seeds and at high growth rates. Carefully choosing seeds reduces the strain in the grown material for a given growth rate.

4 Claims, 3 Drawing Figures

SCREENING SEEDS FOR QUARTZ GROWTH

FIELD OF THE INVENTION

This invention relates to techniques used in hydrothermal synthesis of quartz.

BACKGROUND OF THE INVENTION

Hydrothermal quartz on basal plane (0001) and +5°X (rotated +5° from basal plane) seeds has been grown in the laboratory and in production for more than a decade. Systematic studies of the dependence of growth rate on fundamental and engineering parameters have been carried out. Synthetic quartz grown on minor rhombohedral seed plates ("z" or minor rhombohedral quartz sometimes called r-face quartz grown on (10$\bar{1}$1) seeds) is most economical for the fabrication of AT-cut piezoelectric resonators. These resonators are used in large quantities for monolithic crystal filters and for oscillator plates. Such quartz has been grown for more than 5 years in production.

Experience has shown that synthetic quartz tends to be susceptible to cracking both during the growth process itself, or later in processing the quartz into crystal units. We have established that both of these can result from crystal faults that are propagated into the grown material from faulty seeds. This new and significant observation has indicated a need for attention to seed quality beyond that generally thought necessary.

We have found further that many of these physical defects in the grown material are related to the presence of strains in the seed from which the material is grown.

According to the invention seed crystals used for hydrothermal growth are screened by a novel technique to insure that the seeds are relatively strain free. The screening procedure involves a polariscope examination of the prospective seed crystals in order to detect the kind of gross strains that have been implicated in this work as inducing undesired strains in the grown crystal.

It is well known that strain induces birefringence in transparent crystals and that this birefringence can be seen by passing polarized light through the crystal. Polariscopic examination of quartz to detect twinning and to locate the optic axis in natural quartz has been used for many years. See, for example, G. K. Burns, *Bell System Technical Journal*, 19, page 516 (1940). For these purposes roughly monochromatic, uncollimated light is used. However, these prior techniques are not sufficiently sensitive to reveal the strains that are of interest in connection with this invention. In order to find strains of this level it is necessary to first, know to look for them, and second, to use the refined polariscopic method now to be described.

To detect the level of strains that are useful in the screening technique of the invention it is necessary to use a plane-parallel sample, to collimate the analyzing light, to direct the analyzing light reasonably precisely along the optic axis, and to use nearly monochromatic light. This will produce a birefringence pattern over the area of the seed crystal that reveals the strain state of the crystal. The birefringence pattern can be evaluated by inspection or can be analyzed quantitatively by appropriate apparatus also to be described.

DETAILED DESCRIPTION OF THE INVENTION

The screening technique of the invention may be more readily appreciated from the following detailed description in which.

Apparatus details for laboratory and pilot plant growth have been given in the literature, so we give here only a brief outline. Growth was conducted in the laboratory in 1 inch inside diameter × 12 inch inside length Timken 22A-"S" alloy steel modified-Bridgman-closure vessels. Seeds (usually of predetermined strain) were mounted on Ag plated wire frames. Nutrient (Brazilian α-quartz "lasca" of about one-fourth inch average size) was placed below a 5% baffle. The autoclave was filled to a predetermined fraction of its free volume (% fill) with 1.0M (Molar) NaOH + 0.025M $Li_2CO_3$. $Li^+$ salts have been previously shown to improve acoustic Q.

Following closure, the autoclave was placed in a furnace designed to heat the bottom hotter than the top and was brought to the desired crystallization temperature and temperature difference between dissolving temperature and crystallization temperature ($\Delta T$). Following the runs the crystals were removed and the total increase in thickness was used to establish the average growth rate after which measurements to determine strain and acoustic Q were made. Similar procedures were used in production growth except that the autoclaves were 6 inch or 10 inch inside diameter × 10 foot inside length.

Acoustic Q was measured by determining the infrared absorption on polished plates of appropriate thickness at 3500 $cm^{-1}$ and converting to acoustic Q.

Figure 1:
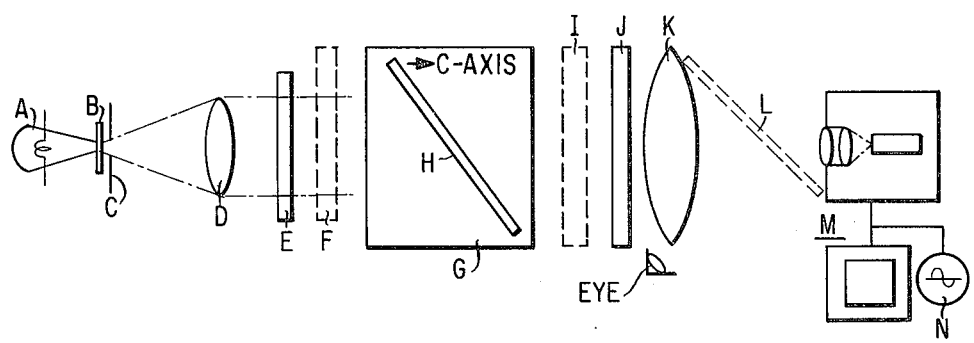
FIG. 1 is a schematic representation of the equipment used to screen the seed crystals in accordance with the invention.

A plane view of the strain measuring apparatus is shown in FIG. 1. The light source (A) is a 150 W. tungsten filament projection lamp with a high numerical aperture mirror inside the glass bulb. This mirror focuses the lamp onto a ground-glass (fused quartz) surface, B. C is a 5 mm dia. aperture and D is the condenser lens (4 inch dia., f.l. 10½ inches) with the aperture C at its focal distance, giving highly collimated light through the apparatus. E is a 4 inch dia., HN-22 Polaroid polarizer and F is an optional one-fourth wave plate. G is a tank made of plate glass containing a liquid whose refractive index matches quartz. A holder in the tank positions a seed plant H so that its optic axis is accurately parallel to the light beam. Another (optional) one-fourth wave plate can be inserted at I and the analyzer is J. A field lens, K (like D) collects the light which is either reflected by a mirror L to the observer's eye or to a silicon diode array video camera with a 12.5 to 75 mm f.l. zoom lens and monitor, M. The video waveform is displayed on an oscilloscope, N. A narrow band interference filter (passband at 5461 A, full width at half max. 100 A) is placed either before the eye or before the camera. Without the one-fourth wave plates, the apparatus is basically a linear polariscope and with them it is a circular polariscope.

For brevity only the linear polariscope will be treated here. The sensitivity of the apparatus as described is sufficient to reveal macroscopic strain areas in all synthetic (and many natural) samples thus far examined. The sensitivity can be increased by several modifications, if necessary.

The use of the video camera is desirable for two reasons. It increases operator productivity in routine inspection because it eliminates the necessity for the operator to place his eye at a fixed location. More importantly, it permits semiquantitative measurement of the severity of the strain. This is done simply by observing the height of the peaks on the video waveform on an oscilloscope. The peaks are proportional to the brightness of the strain spots and the brightness varies with the strain. The brightness is not simply related to the strain levels in the sample because the observed birefringence is proportional to the difference in the principal strains at each point and is also a function of the directions of the principal strains because the stress-optic coefficient varies with direction in the crystal.

The video peak heights are conveniently calibrated by using an optical compensator, e.g., a Berek rotary compensator. A convenient unit of measurement is 0.001 waves of retardation, herein called $1r$. This becomes a figure of merit for the seed plates. The $r$ value actually used in a given screening process will depend on the quality and yield desired for the product. Seed crystals with $r$ value of 40 are considered relatively good. A more desirable cutoff, one that utilizes more effectively the screening process, is 20. Whereas this limit is described as an instrument measurement it can be simulated with reasonable accuracy by visual comparison. Once the operator knows what a poor seed ($r > 40$) looks like the operator can compare mentally the patterns of later samples and pass or reject them with reasonable accuracy. Accordingly this invention is intended to include any procedure capable of approximating this standard.

As stated earlier, the sample must be a plane parallel plate, e.g., to $\pm 2°$. Fortunately, seed plates as routinely produced by a gang band saw (with abrasive slurry) are quite satisfactory, (thickness about 0.047 inch) and no polishing is necessary since the plates are immersed in a matching fluid during examination.

The beginning point for choosing conditions for z-face growth was the previous systematic studies of growth rate conducted in the laboratory. From these studies it can be concluded that rate depends on the important parameters as follows:

1. Rate is a linear function of $\Delta T$
2. Rate depends on the growth temperature via the Arrhenius Eq., viz.

$$\frac{d(\ln \mathcal{R})}{dT} = \frac{C}{RT^2}$$

where $\mathcal{R}$ is the rate, $R$ is the gas constant, $T$ is absolute temperature, and $C$ is a constant, the energy of activation which depends on seed orientation.

3. Rate is an approximately linear function of percent fill at low fills and deviates at higher fills.
4. Rate dependence on seed orientation is qualitative as might be predicted from the morphology or recticular density of atoms on the various planes but is in detail rather complicated.

Early data was taken in 0.5M NaOH but recent experience showed that flawing was reduced and acoustic Q was improved in 1.0M NaOH + 0.025M LiOH, so these were chosen for the present growth of z-face quartz.

Safey considerations caused us to set 25,000 psi and 400°C as the upper pressure-temperature limits to be considered. Reference to p-T data for dilute NaOH saturated with quartz at conditions ordinarily used in hydrothermal crystallization suggested 82% fill as providing a safe pressure margin over the expected range of operation. With these boundary conditions the one variable to be fixed was $\Delta T$. As $\Delta T$ increases, at first the rate increases since the effect of increasing supersaturation with increasing $\Delta T$ overrides. At larger $\Delta T$'s the rate decreases as the effect of lower crystallization temperature (the Arrhenius dependence of rate on temperature) overrides. The maximum in rate, about 35 mil/da, is expected near 50° $\Delta T$. As an additional check on this extrapolation a variety of data on the ratio (rate on basal seed)/(rate on z-face) was collected over a variety of conditions. This ratio was found to be in the range 1.8–2.0. At 350° crystallization temperature, 1.0M NaOH + 0.025M $Li_2CO_3$, 82% fill the rate on the basal plane is 65–70 mil/da, so that ~35 mil/da on the z-face might be expected. Growth was conducted at the conditions 350°, $\Delta T$ 50°, 82% fill, 1.0M NaOH + 0.025M LiOH in laboratory and production autoclaves, and the rate obtained was 32–38 mil/da agreement with prediction. The rate was not highly sensitive to small variations in conditions. Further exploration of growth conditions showed these conditions to be an optimum for rate and visual quality given the limitation of present autoclaves. Large crystals were grown and their morphology was very efficient for the cutting of AT resonators.

Repeatability among many growth runs and the uniformity of growth on the many crystals within each run are important factors which affect the costs of growth and device processing. These factors were studied by making detailed dimensional measurements on 336 crystals in three growth runs.

In the runs examined the 16 seeds are placed at each of seven vertical positions on "tiers" in the autoclave. The crystals within each tier are arranged in an array such that 12 crystals are close to the wall of the autoclave and 4 crystals are near to the center of the vessel. No correlation in crystal thickness averaged over the 7 tiers in each run was observed with the position of the crystal within its tier. In a given run the extreme range of crystal thickness was uniform within each tier within 5%. The thickness of the 16 crystals in each tier was averaged. Within a given run the extreme range of crystal thickness was no more than about 8%. The variation of thickness between runs was 15% which was probably caused by inaccurate temperature control. A computer controlled system using a pair of Texas Instrument 960A computers and silicon-controlled-rectifier controllers is presently in use on several autoclaves simultaneously. It would be expected that in addition to operating economics this system will provide greatly improved process control.

Figure 2A:
FIGS. 2A and 2B are photographic representations of birefringent patterns obtained from two seed crystals, one regarded as relatively good in quality and the other regarded as undesirable for seeding growth.
Figure 2B:

An important problem in z-face quartz is the tendency for grown material to crack during growth and processing. Cracking both during growth and during subsequent processing are postulated to be dependent upon strain in the crystals. To investigate this possibility a series of runs using seeds sorted by visual inspection in the polariscope were made. Seeds were placed in two categories: (A) good quality (comparatively moderate strain, although later quantitative investigation showed this strain to be rather substantial), and (B) bad quality (comparatively high strain). See FIGS. 2A and 2B for examples of polariscopic views of (A) (FIG. 2A) and (B) FIG. 2B). The percent of crystals grown on seeds in categories (A) and (B) which were uncracked at the conclusion of the growth runs and the percent of resonator wafers uncracked during processing are given in Table 1. As can be seen, as much as a 20% yield increase can be obtained by appropriate seed choice.

TABLE 1

|  | Category A (moderate strain) | Category B (high strain) |
| --- | --- | --- |
| %crystals uncracked after growth | 88% | 85% |
| %resonator wafers uncracked in processing | 87–77% | 78–56% |

Since these results indicated strain as observed in the polariscope correlated with cracking, a systematic study of strain was undertaken using the strain measurement apparatus described above.

It might be expected that strain would increase at higher growth rates. To test this hypothesis seeds of predetermined strain were used in a series of runs at various growth rates. Growth rate was altered by changing $\Delta T$. In the first experiments the initial seeds were visually preinspected and only those seeds qualifying as "good" were used. Quantitative measurements showed that the strain in grown quartz increases as the growth rate increases.

Random events, perhaps the inclusion of particulate matter, e.g., corrosion products flaking from the vessel wall, can introduce strain unrelated to either the original seed or to the growth process. Visual polariscope examination turned up occasional "spontaneously" generated strain regions not associated with strain in the seed.

While the intensity of strain tends to decrease with increasing distance from the seed, the areas encompassed by a given strained region tends to increase. This effect was easy to see by comparing slices at increasing distance from the seeds where it was observed that a strain pattern on a particular seed of fraction of a millimeter in areas could generate a strained region in a grown crystal of millimeters in extent. To further study strain as a function of growth rate, seeds whose initial strain was quantitatively measured were used in runs of varying growth rates. The strain again increases with growth rate. However, it is clear that in some cases low strain crystals can be grown even at high rates when low strain initial seeds are used.

X-ray topographs were compared in a preliminary way to the strain patterns observed in the polariscope and the same general features were observed.

Various additional modifications and extensions of this invention will become apparent to those skilled in the art. All such variations and deviations which basically rely on the teachings through which this invention has advanced the art are properly considered to be within the spirit and scope of this invention.

What is claimed is:

1. In a method for hydrothermal growth of quartz crystals in which growth of quartz occurs on a quartz crystal seed plate immersed in a hydrothermal solution containing nutrient quartz and maintained under temperature and pressure such that the nutrient quartz dissolves and recrystallizes on the seed plate the improvement characterized in that the internal strain of the seed plate is first examined by exposing the surface of the seed plate to visible polarized light that is monochromatic within $\pm 200$ A within a beam that is collimated to $\pm 2°$ and is directed $\pm 2°$ along the optic axis of the seed plate, then determining the approximate $r$ value of the seed plate, $r$, being 0.001 waves of light retardation, and selecting those seed plates for use having an $r$ value of 20 or less.

2. The method of claim 1 in which the seed plate is a z-face (minor rhombohedral) seed.

3. The method of claim 1 in which the hydrothermal solution comprises NaOH.

4. The method of claim 1 in which the quartz recrystallizes on the seed plate at a rate in excess off 32 mils/day.

* * * * *